US011101610B2

(12) United States Patent
Liao (10) Patent No.: US 11,101,610 B2
(45) Date of Patent: Aug. 24, 2021

(54) CONNECTOR CONVERTER

(71) Applicant: GUANGDONG GOPOD GROUP HOLDING CO., LTD., Shenzhen (CN)

(72) Inventor: Zhuowen Liao, Shenzhen (CN)

(73) Assignee: Guangdong Gopod Group Holding Co., Ltd., Shenzhen (CN)

( * ) Notice: Subject to any disclaimer, the term of this patent is extended or adjusted under 35 U.S.C. 154(b) by 0 days.

(21) Appl. No.: 16/626,876

(22) PCT Filed: Oct. 11, 2017

(86) PCT No.: PCT/CN2017/105691
§ 371 (c)(1),
(2) Date: Dec. 26, 2019

(87) PCT Pub. No.: WO2019/071466
PCT Pub. Date: Apr. 18, 2019

(65) Prior Publication Data
US 2020/0244021 A1    Jul. 30, 2020

(51) Int. Cl.
*H01R 31/06* (2006.01)
*H01R 27/02* (2006.01)
*H05K 5/00* (2006.01)

(52) U.S. Cl.
CPC ........... *H01R 31/065* (2013.01); *H01R 27/02* (2013.01); *H05K 5/0069* (2013.01)

(58) Field of Classification Search
CPC .. H05K 7/20127; H01R 13/514; H01R 12/58; H01R 12/53; H01R 13/5804;
(Continued)

(56) References Cited

U.S. PATENT DOCUMENTS 5,788,521 A * 8/1998 Milan ................. H01R 13/514
439/101
6,203,333 B1    3/2001 Medina et al.
(Continued)

FOREIGN PATENT DOCUMENTS

CN    201601252 U    10/2010
CN    103618160 A    3/2014
(Continued)

OTHER PUBLICATIONS

International Search Report and Written Opinion, for international Application No. PCT/CN2017/105691.
(Continued)

*Primary Examiner* — Jean F Duverne
(74) *Attorney, Agent, or Firm* — Wolf, Greenfield & Sacks, P.C.

(57) ABSTRACT

Provided is a connector converter, comprising a shell, a circuit board assembly and a connecting wire, wherein the circuit board assembly comprises a digital signal board integrated with a digital circuit, the digital signal board being provided in the shell, and the digital signal board being provided with a plurality of output interfaces; the shell is provided with outer pockets positioned corresponding to the output interfaces; and an inner end of the connecting wire is provided with a metal plate, the metal plate being embedded in the digital signal board and electrically connected to the digital signal board via a connecting terminal, and an outer end of the connecting wire extends out to the outside of the shell and is provided with an input interface. The metal plate is in embedded connection with the digital signal board.

17 Claims, 6 Drawing Sheets

(58) Field of Classification Search
CPC ............. H01R 13/6595; H01R 24/60; H01R 13/6658; H01R 31/06; G02B 6/4292
See application file for complete search history.

(56) References Cited

U.S. PATENT DOCUMENTS

| | | | |
|---|---|---|---|
| 7,563,136 | B1 | 7/2009 | Wu |
| 7,621,758 | B2 | 11/2009 | Tsao |
| 8,043,122 | B1 | 10/2011 | Cho et al. |
| 10,978,841 | B2 | 4/2021 | Liao |
| 2009/0060425 | A1* | 3/2009 | Aronson ............ G02B 6/4292 385/88 |
| 2009/0129002 | A1 | 5/2009 | Wu et al. |
| 2012/0094508 | A1 | 4/2012 | Tao et al. |
| 2013/0040470 | A1 | 2/2013 | Gao et al. |
| 2014/0078387 | A1 | 3/2014 | Tao et al. |
| 2017/0005446 | A1* | 1/2017 | Regnier ............ H05K 7/20127 |
| 2018/0165053 | A1 | 6/2018 | Kuo et al. |
| 2019/0204882 | A1 | 7/2019 | Tseng et al. |
| 2019/0341714 | A1 | 11/2019 | Du et al. |
| 2019/0341793 | A1 | 11/2019 | Chien |
| 2020/0235538 | A1 | 7/2020 | Liao |

FOREIGN PATENT DOCUMENTS

| | | |
|---|---|---|
| CN | 204835144 U | 12/2015 |
| CN | 205051062 U | 2/2016 |
| CN | 205452558 U | 8/2016 |
| CN | 106253012 A | 12/2016 |
| CN | 206259586 U | 6/2017 |
| WO | WO 2011/031114 A2 | 3/2011 |

OTHER PUBLICATIONS

International Preliminary Report on Patentability for International Application No. PCT/CN2017/105691, dated Apr. 23, 2020.
International Preliminary Report on Patentability for International Application No. PCT/CN2017/105692, dated Apr. 23, 2020.
International Search Report and Written Opinion for International Application No. PCT/CN2017/105692, dated Jan. 23, 2018.

\* cited by examiner

CONNECTOR CONVERTER

RELATED APPLICATIONS

This application is a 371 National Stage application claiming priority to International Application No. PCT/CN2017/105691, filed Oct. 11, 2017. The aforementioned application is incorporated herein by reference, in its entirety, for any purposes.

TECHNICAL FIELD

The present invention belongs to the technical field of converters, and particularly relates to a connector converter.

BACKGROUND OF THE INVENTION

A connector converter is a device that can convert connectors to each other for the purpose of signal conversion or charging interface conversion. An existing connector converter generally comprises a shell, a printed circuit board provided in the shell, an adapter socket mounted on the printed circuit board, and a wire welded to the printed circuit board and used for receiving electrical signals or other signals. However, according to the existing connector converter, the connection between the wire and the printed circuit board generally uses spot welding, that is, the wire is welded only at a welding hole formed on the printed circuit board, and the welding area between the wire and the printed circuit board is small. This arrangement will cause the wire to be prone to falling off from the printed circuit board, and the process to be poor.

Technical Problem

An object of the present invention is to provide a connector converter to solve the technical problem in the prior art that the connection between the wire and the circuit board of the connector converter is prone to detachment.

SUMMARY OF THE INVENTION

Solution to Problem

Technical Solution

In order to solve the above-mentioned technical problem, a technical solution used by the embodiment of the present invention is to provide a connector converter, the connector converter comprises a shell, a circuit board assembly and a connecting wire, wherein the circuit board assembly comprises a digital signal board integrated with a digital circuit, the digital signal board being provided in the shell, and the digital signal board being provided with a plurality of output interfaces; the shell is provided with outer pockets positioned corresponding to the output interfaces such that the output interfaces are exposed; and an inner end of the connecting wire is provided with a metal plate, the metal plate being embedded in the digital signal board and electrically connected to the digital signal board via a connecting terminal, and an outer end of the connecting wire extends out to the outside of the shell and is provided with an input interface.

Preferably, a connecting position between the connecting terminal and the metal plate is provided with a UV adhesive fixedly sealing on the digital signal board.

Preferably, the metal plate comprises a middle plate part, a first lateral plate part and a second lateral plate part, the middle plate part being fixedly connected to the inner end of the connecting wire, the first lateral plate part and the second lateral plate part being respectively connected to two ends of the same side of the middle plate part, and the first lateral plate part and the second lateral plate part being both electrically connected to the digital signal board via the connecting terminal; and a bottom end of the first lateral plate part being provided with a first embedding part, a bottom end of the second lateral plate part being provided with a second embedding part, the digital signal board being provided with a first embedding groove and a second embedding groove at a position close to an end thereof, the first embedding part and the second embedding part being respectively embedded in the first embedding groove and the second embedding groove such that the metal plate is fixedly connected to the digital signal board.

Preferably, the digital signal board is provided with a mounting notch positioned below the position between the first lateral plate part and the second lateral plate part, and the middle plate part is clamped in the mounting notch.

Preferably, the inner end of the connecting wire is fixedly connected to the middle plate part via a wire clamping ring.

Preferably, the circuit board assembly further comprises a power source board integrated with a power source circuit, the power source board being provided in the shell and electrically connected to the digital signal board, and the digital signal board and the power source board being provided side by side.

Preferably, the digital signal board and the power source board are provided side by side in a vertical direction.

Preferably, the digital signal board and the power source board are provided at a distance from each other.

Preferably, the output interfaces are positioned between the digital signal board and the power source board to space apart the digital signal board and the power source board.

Preferably, the digital signal board is electrically connected to the power source board via at least one pin header set.

Preferably, each of the pin header set comprises a plurality of connecting pin headers which are provided side by side, and each of the connecting pin header is vertically welded between the digital signal board and the power source board.

Preferably, the output interfaces are any combination of a USB interface, an HDMI interface, a DVI interface, an RJ45 interface and a Lightning interface.

Preferably, the input interface is a Type-C interface or a Micro USB interface.

Preferably, the digital signal board and/or the power source board is provided with a plurality of electronic devices.

Preferably, the shell comprises an outer frame and two plugs, the outer frame being provided with a mounting cavity and the mounting cavity penetrating through two ends in a length direction of the outer frame, the two plugs being plugged at two ends of the mounting cavity, and the outer pockets being formed in the outer frame and/or the plug.

Preferably, the shell further comprises a plastic member, the plastic member being fixed in the mounting cavity, the plastic member being provided with an inner pocket positioned corresponding to the outer pocket formed in the outer frame, and the end of the output interface corresponding to the inner pocket being fixed to the inner pocket.

Preferably, the outer frame is an aluminum alloy frame with an oxide layer formed on the surface.

BENEFICIAL EFFECTS OF THE INVENTION

Beneficial Effects

Compared with the prior art, the beneficial effects of the connector converter of various embodiments of the present invention are as follows: according to a connector converter of the present invention, conversion between connectors can be achieved by connecting an input interface provided at an outer end of a connecting wire with an interface needing signal conversion or an interface of a charging power source, and then plugging a data cable connected to an electronic product in an outer pocket exposed outside an exposed shell; and a metal plate is provided at an inner end of the connecting wire of the connector converter of the present invention, the metal plate is in embedded connection with a digital signal board of the circuit board assembly, and then the metal plate is electrically connected to the digital signal board via a connecting terminal, such that an electric connection and a mechanical connection are achieved for the connecting wire and the digital signal board, and the mechanical connection is achieved by an embedding manner instead of welding, thus greatly improving stability of the mechanical connection between the connecting wire and the digital signal board, avoiding falling off of the connecting wire during use of the connector converter, and ensuring a better effect in use of the connector converter.

BRIEF DESCRIPTION OF THE DRAWINGS

In order to more clearly explain the technical solutions in the embodiments of the present invention, the accompanying drawings to be used in the description of the embodiments or the prior art will be briefly introduced below. Obviously, the accompanying drawings described below are merely some embodiments of the present invention, and a person of ordinary skill in the art would have obtained other drawings according to these drawings without involving any inventive effort.

Reference signs in the drawings are as follows:

| | | |
|---|---|---|
| 10. Shell | 11. Outer frame | 12. Plug |
| 13. Plastic member | 20. Digital signal board | 21. First embedding groove |
| 22. Second embedding groove | 23. Mounting notch | 30. Power source board |
| 40. Connecting wire | 50. Input interface | 60. Output interface |
| 70. Pin header set | 71. Connecting pin header | 80. Wire clamping ring |
| 90. Metal plate | 91. First lateral plate part | 92. Second lateral plate part |
| 93. Middle plate part | 94. First embedding part | 95. Second embedding part |
| 100. Connecting terminal | 110. UV adhesive | 111. Outer pocket |
| 120. Electronic device | 131. Inner pocket. | |

DETAILED DESCRIPTION OF EMBODIMENTS

Embodiments of the present invention will be described below in detail, and examples of the embodiments are shown in the drawings, wherein the same or similar reference numerals throughout the drawings represent the same or similar elements or the elements having the same or similar functions. The embodiments described below with reference to FIGS. 1-7 are exemplary and are intended to be illustrative of the present invention, and will not be interpreted as limiting the present invention.

In the description of the present invention, it should be understood that the orientation or positional relationships indicated by the terms "length", "width", "upper", "lower", "front"; "rear", "left", "right", "vertical", "horizontal", "top", "bottom", "inner", "outer" and the like are based on the orientation or positional relationship shown in the accompanying drawings and are only for facilitating the description of the present invention and simplifying the description, rather than indicating or implying that the device or element referred to must have a particular orientation or be constructed and operated in a particular orientation, and therefore will not be interpreted as limiting the present invention.

In addition, the terms "first" and "second" are for descriptive purposes only and should not be construed as indicating or implying relative importance or implicitly indicating the number of technical features indicated. Thus, the features defined with "first" and "second" can explicitly or implicitly include one or more of the features. In the description of the present invention, the word "multiple" means two or more, unless otherwise explicitly and specifically defined.

In the present invention, unless otherwise explicitly specified and defined, terms "mounting", "connecting", "connection", "fix" and the like should be understood in a broad sense, for example, they can be a fixed connection, a detachable connection, or being integrated; can be a mechanical connection and can also be an electric connection; and can be a direct connection and can also be an indirect connection through an intermediate medium, and can be communication between interiors of two elements or interaction between two elements. For those of ordinary skill in the art, the specific meaning of the terms mentioned above in the present invention should be construed according to specific circumstances.

As shown in FIGS. 1-7, the connector converter provided in the embodiment of the present invention comprises a shell 10, a circuit board assembly and a connecting wire 40, wherein the circuit board assembly comprises a digital signal board 20 integrated with a digital circuit, the digital signal board 20 being provided in the shell 10, and the digital signal board 20 being provided with a plurality of output interfaces 60; the shell 10 is provided with outer pockets 111 positioned corresponding to the output interfaces 60 such that the output interfaces 60 are exposed; and an inner end of the connecting wire 40 is provided with a metal plate 90, the metal plate 90 being embedded in the digital signal board 20 and electrically connected to the digital signal board 20 via a connecting terminal 100, and an outer end of the connecting wire 40 extends out to the outside of the shell 10 and is provided with an input interface 50. As shown in combination with FIGS. 2 and 5 and 6, specifically, according to the connector converter of the embodiment of the present invention, conversion between connectors can be achieved by connecting an input interface 50 provided at an outer end of a connecting wire 40 with an interface needing signal conversion or an interface of a charging power source, and then plugging a data cable connected to an electronic product in an outer pocket 111 exposed outside an exposed shell 10; and a metal plate 90 is provided at an inner end of the connecting wire 40 of the connector converter of the present invention, the metal plate 90 is in embedded connection with a digital signal board 20 of the circuit board assembly, and then the metal plate 90 is electrically connected to the digital signal board 20 via a connecting terminal 100, such that an electric connection and a mechanical connection are achieved for the connecting wire 40 and the digital signal board 20, and the mechanical connection is achieved by an embedding manner instead of welding, thus greatly improving stability of the mechanical connection between the connecting wire 40 and the digital signal board 20, avoiding falling off of the connecting wire 40 during use of the connector converter, and ensuring a better effect in use of the connector converter.

Figure 5:
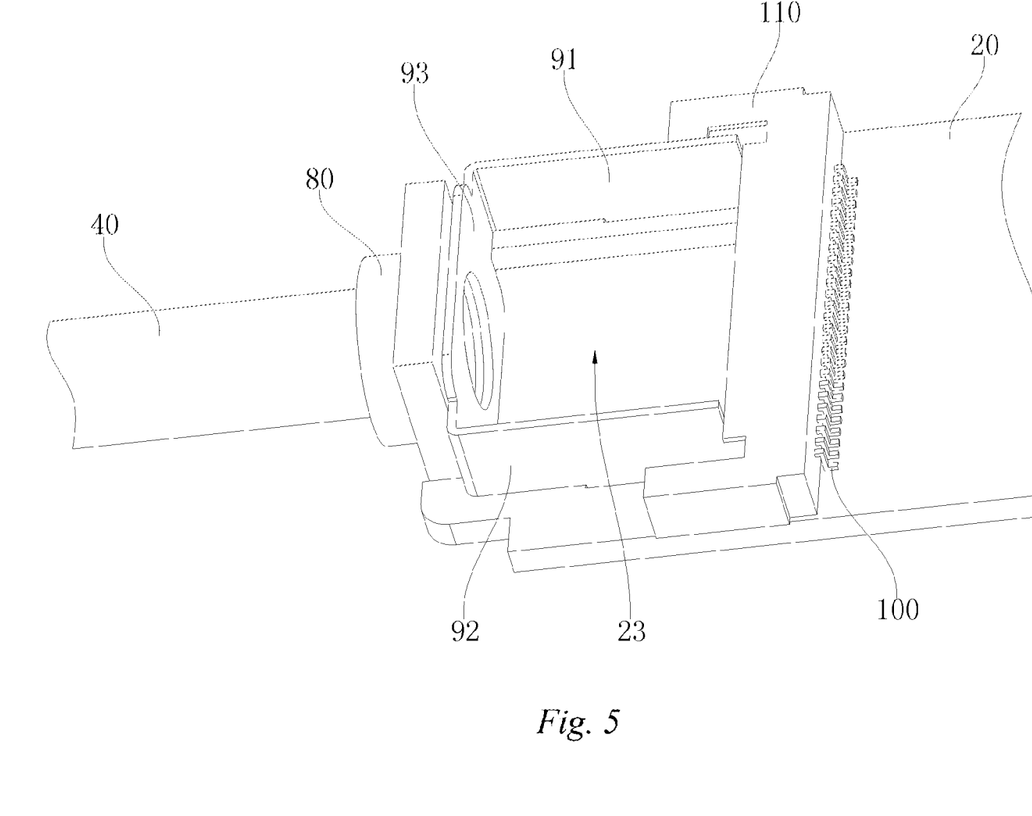
FIG. 5 is a schematic structural diagram of the connector converter with the connecting wire being connected to the digital signal board via the metal plate provided by the embodiment of the present invention.

In the present embodiment, as shown in FIG. 5, a connecting position between the connecting terminal 100 and the metal plate 90 is provided with a UV adhesive 110 fixedly sealing on the digital signal board 20. Specifically, the function of the UV adhesive 110 is to reinforce connection between the connecting terminal 100 and the metal plate 90, and further, to fix the connecting terminal 100 and the metal plate 90 to the digital signal board 20. The three, i.e. the metal plate 90, the connecting terminal 100 and the digital signal board 20 are contained via the UV adhesive 110, thus greatly improving stability among the connection of the metal plate 90, the connecting terminal 100 and the digital signal board 20. In addition, the UV adhesive 110 is of an insulation material and can effectively prevent interference with working of other components on the digital signal board 20, that is, besides reinforcing the stability of the connection among the metal plate 90, the connecting terminal 100 and the digital signal plate 20, the UV adhesive 110 does not cause other adverse problems.

Figure 6:
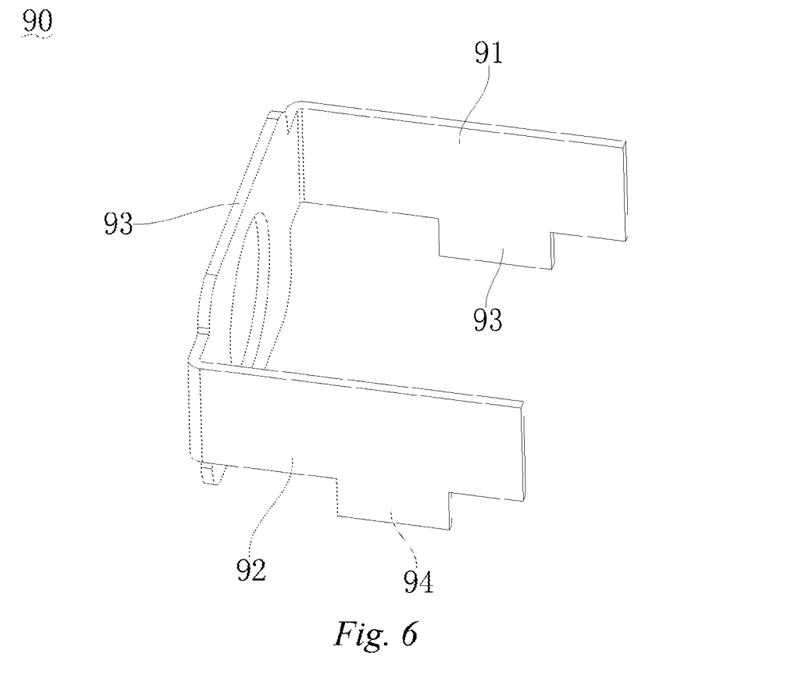
FIG. 6 is a schematic structural diagram of the metal plate of the connector converter provided by the embodiment of the present invention.
Figure 7:
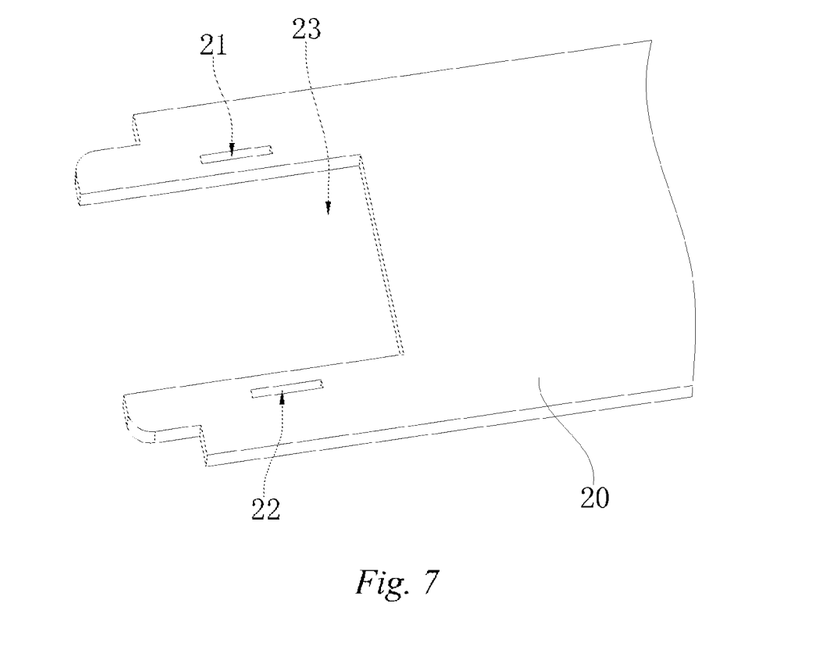
FIG. 7 is a schematic structural diagram of the digital signal board of the connector converter provided by the embodiment of the present invention.

In the present embodiment, as shown in FIGS. 5-7, the metal plate 90 comprises a middle plate part 93, a first lateral plate part 91 and a second lateral plate part 92, the middle plate part 93 being fixedly connected to the inner end of the connecting wire 40, the first lateral plate part 91 and the second lateral plate part 92 being respectively connected to two ends of the same side of the middle plate part 93, and the first lateral plate part 91 and the second lateral plate part 92 being both electrically connected to the digital signal board 20 via the connecting terminal 100; and bottom end of the first lateral plate part 91 being provided with a first embedding part 94, a bottom end of the second lateral plate part 92 being provided with a second embedding part 95, the digital signal board 20 being provided with a first embedding groove 21 and a second embedding groove 22 at a position close to an end thereof, the first embedding part 94 and the second embedding part 95 being respectively embedded in the first embedding groove 21 and the second embedding groove 22 such that the metal plate 90 is fixedly connected to the digital signal board 20. Specifically, the middle plate part 93 is connected between the first lateral plate part 91 and the second lateral plate part 92, the middle plate part 93 is fixedly connected to the connecting wire 40, the first embedding part 94 provided on the first lateral plate part 91 and the second embedding part 95 provided on the second lateral plate part 92 are respectively in embedded connection with the first embedding groove 21 and the second embedding groove 22 of the digital signal board 20, in this way, the connecting wire 40 is mechanically connected to the digital signal board 20 at positions of two points via the first embedding part 94 and the second embedding part 95, thus greatly improving stability of connection between the connecting wire 40 and the digital signal board 20, and the connecting wire 40 is not prone to detachment from the digital signal board 20 even if a certain extra force is applied to pull the connecting wire 40.

When the first embedding part 94 and the second embedding part 95 are respectively in embedded connection with the first embedding groove 21 and the second embedding groove 22, the bottom end of the first lateral plate part 91 and the bottom end of the second lateral plate part 92 both abut against the surface of the digital signal board 20, in this way, on the one hand, the condition that waggling and the like that may occur and cause connection loosening due to gaps existing between the first lateral plate part 91 and the second lateral plate part 92 and the digital signal board 20 can be avoided, on the other hand, during assembly, whether the first lateral plate part 91 and the second lateral plate part 92 are mounted in place can be quickly known by observing, thus decreasing various problems in subsequence use caused by poor installation.

In the present embodiment, the width of the middle plate part 93 is greater than that of the first lateral plate part 91 and the second lateral plate part 92, and the width of the first lateral plate part 91 is equal to that of the second lateral plate part 92.

Preferably, the metal plate 90 is manufactured by integrally forming the middle plate part 93, the first lateral plate part 91, the second lateral plate part 92, the first embedding part 94 and the second embedding part 95, the metal plate 90 manufactured by integral forming is high in structural strength, and is suitable for mass production, the production cost is low, and meanwhile, the manufactured metal plate 90 product is high in uniformity.

More specifically, as shown in FIG. 6, the configuration structure of the metal plate 90 is generally in a U shape, and the metal plate 90 of such a structure is good in stability and more reliable in use.

Figure 4:
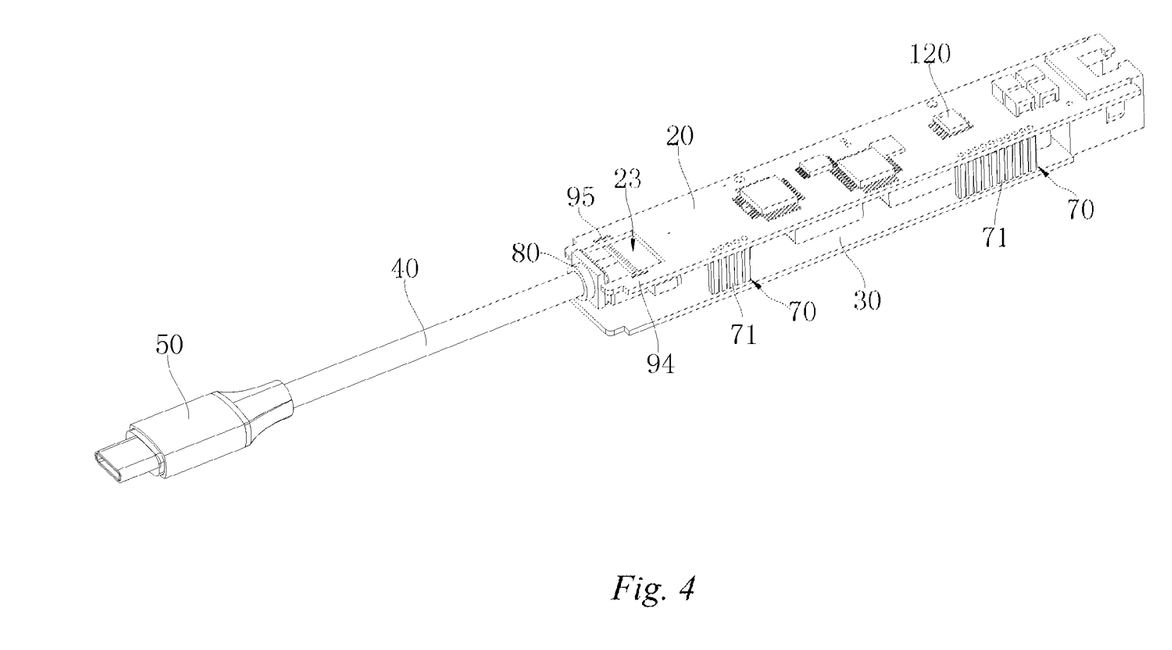
FIG. 4 is a second schematic structural diagram of the connector converter with the shell being hidden provided by the embodiment of the present invention.

In the present embodiment, as shown in FIGS. 4 and 5 and 7, the digital signal board 20 is provided with a mounting notch 23 positioned below the position between the first lateral plate part 91 and the second lateral plate part, and the middle plate part 93 is clamped in the mounting notch 23. Specifically, the first embedding groove 21 and the second embedding groove 22 are respectively positioned at opposite edges close to the mounting notch 23, in this way, after the metal plate 90 is connected to the digital signal board 20, the first lateral plate part 91 and the second lateral plate part 92 are respectively positioned at the opposite edges close to the mounting notch 23, and the middle plate part 93 right faces the mounting notch 23, and the connecting wire 40 connected to the middle plate part 93 is centralized, and the connecting wire 40 is indirectly contained via the first lateral plate part 91 and the second lateral plate part 92 at two points in a width direction of the digital signal board 20, such that the connection between the connecting wire 40 and the digital signal board 20 is stable and reliable.

Figure 1:
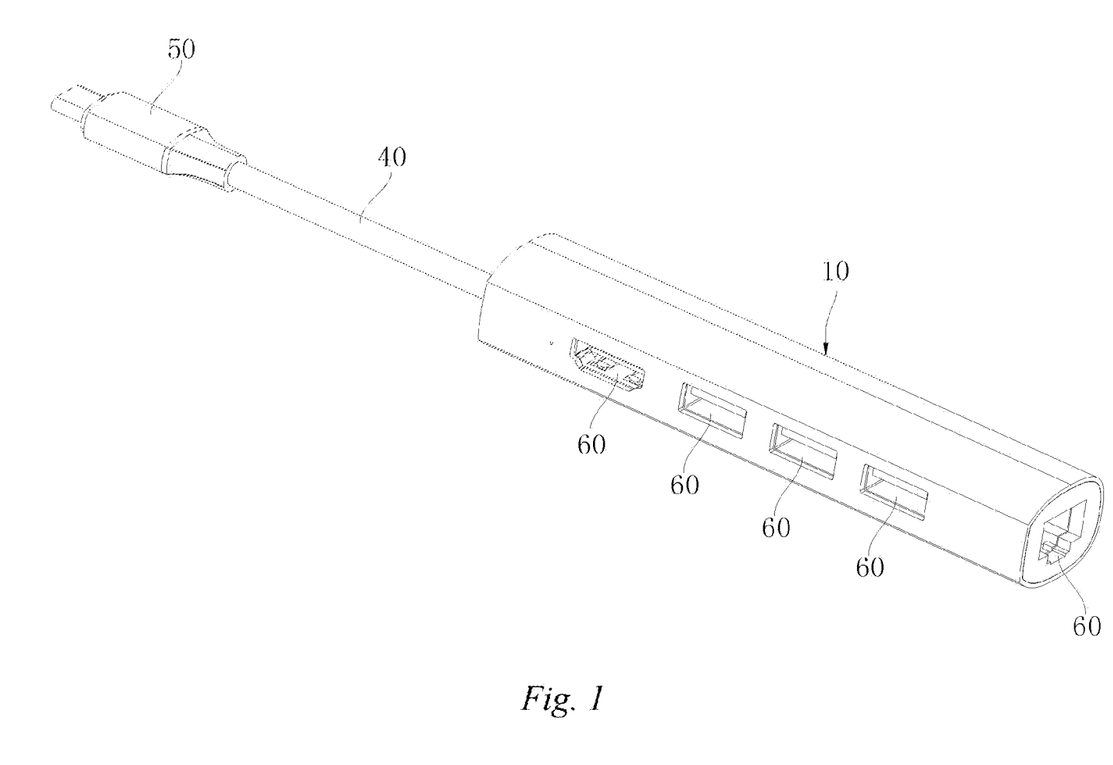
FIG. 1 is a structurally schematic diagram of a connector converter provided by an embodiment of the present invention.
Figure 2:
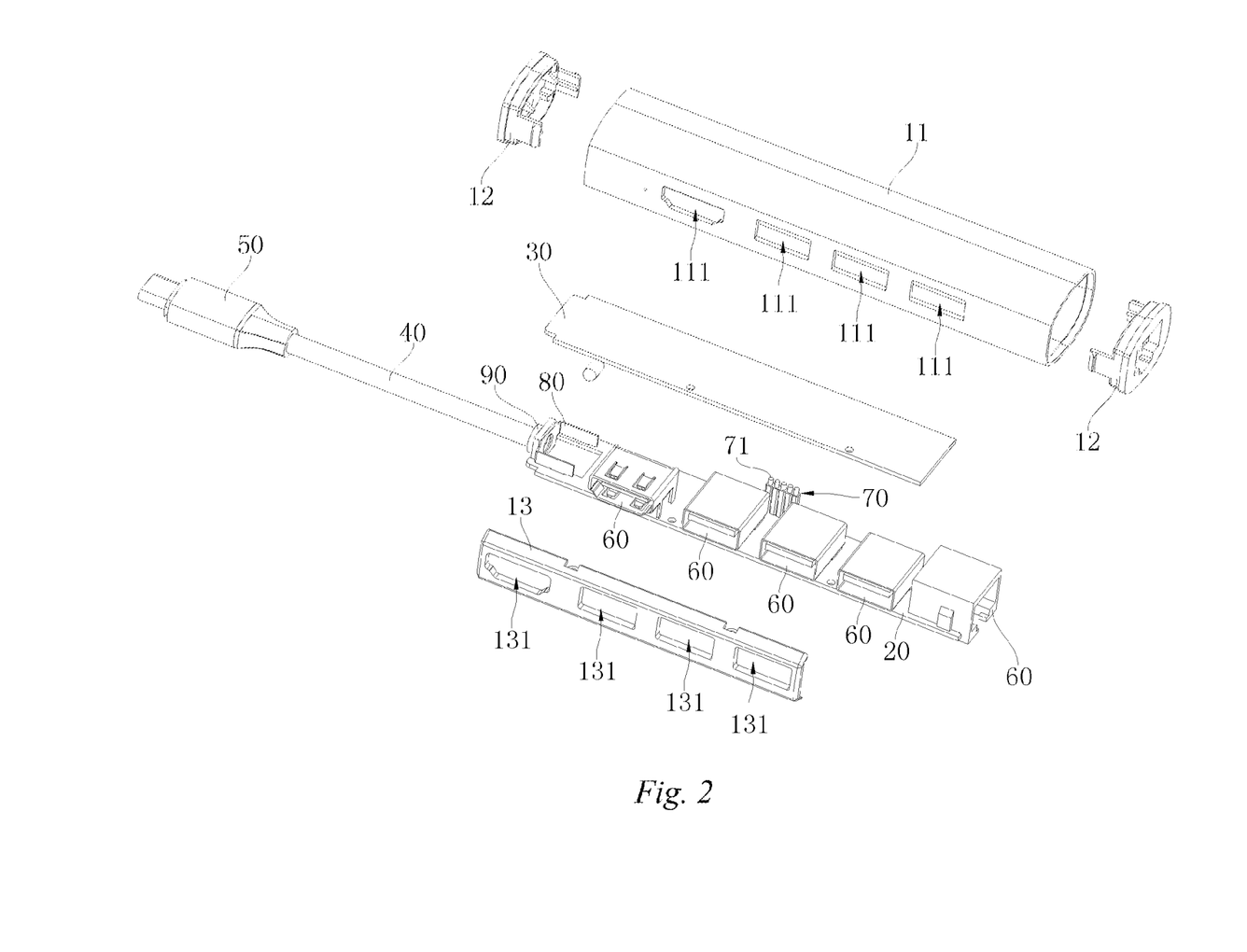
FIG. 2 is a schematic exploded structural diagram of the connector converter provided by the embodiment of the present invention.
Figure 3:
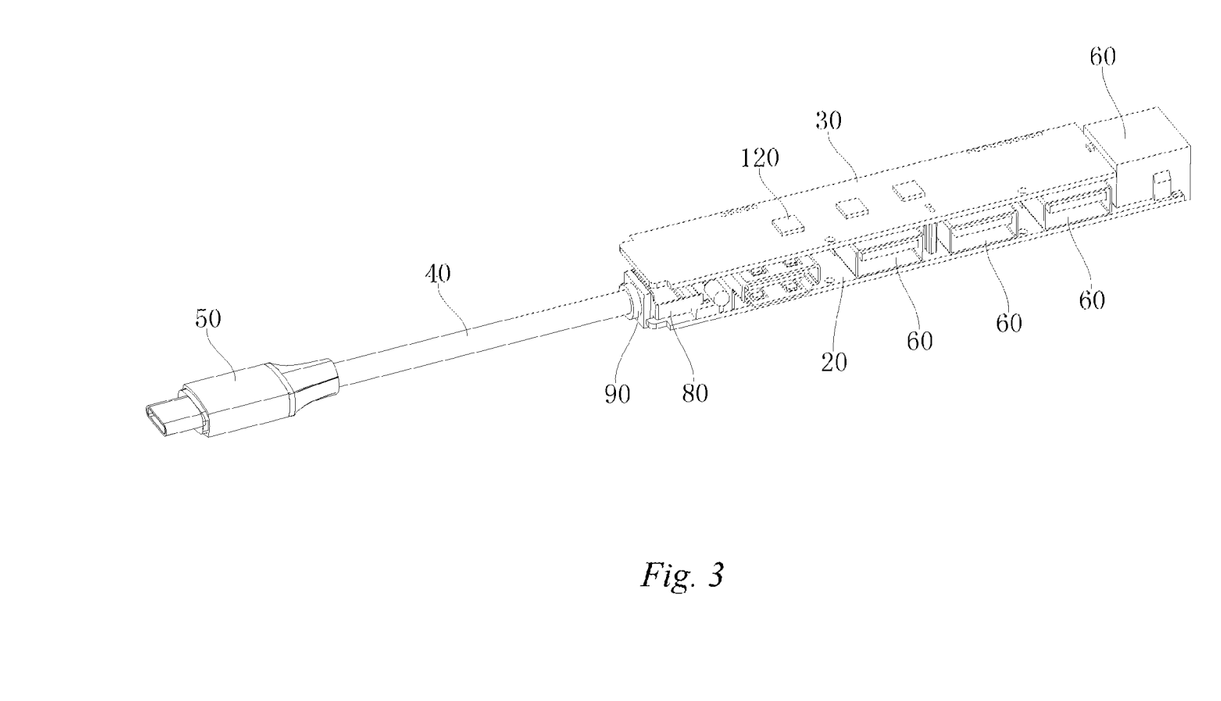
FIG. 3 is a first schematic structural diagram of the connector converter with a shell being hidden provided by the embodiment of the present invention.

In the present embodiment, as shown in FIGS. 2-4, the inner end of the connecting wire 40 is fixedly connected to the middle plate part 93 via a wire clamping ring 80. Specifically, a plastic material can be used for supporting the wire clamping ring 80; and by means of the wire clamping ring, the middle plate part 93 of the metal plate 90 and the connecting wire 40 can be firmly connected, the end of the connecting wire 40 can be protected, the connecting wire 40 can be prevented from end breaking during long-time use, and the service life of the connector converter is prolonged.

In the present embodiment, as shown in combination with FIGS. 2-4, the circuit board assembly further comprises a power source board 30 integrated with a power source circuit, the power source board 30 being provided in the shell 10 and electrically connected to the digital signal board 20, and the digital signal board 20 and the power source board 30 being provided side by side. Specifically, a digital circuit and a power source circuit are respectively integrated on the digital signal board 20 and the power source board 30, in this way, when the connector converter works, signal interference between the digital circuit and power source circuit can be effectively avoided, and further a better effect in use of the connector converter is ensured; and Meanwhile, heat dissipation of the connector converter is more facilitated. In addition, the digital signal board 20 and the power source board 30 are provided side by side, in this way, when the digital signal board 20 and the power source board 30 are mounted, the best position can be conveniently placed in space to save the space occupied by the digital signal board 20 and the power source board 30.

In the present embodiment, as shown in FIGS. 3 and 4, the digital signal board 20 and the power source board 30 are provided side by side in a vertical direction. In this way, the position occupied by the whole connector converter in a length direction in a limited space is reduced, further, the volume of the whole connector converter can be reduced, and the miniaturization design of the connector converter is facilitated.

In the present embodiment, as shown in FIGS. 3 and 4, the digital signal board 20 and the power source board 30 are provided at a distance from each other. Specifically, the digital signal board 20 and the power source board 30 are provided at a distance from each other, such that a gap can be formed between the digital signal board 20 and the power source board 30, in this way, heat generated by the digital signal board 20 and the power source board 30 can dissipate in the gap, thus effectively ensuring dissipation of the heat generated by the digital signal board 20 and the power source board 30, and therefore influence on working or a shortened service life due to accelerated aging of various components caused by excessive heat of the interior of the connector converter are avoided.

In the present embodiment, as shown in FIGS. 3 and 4, the output interfaces 60 are positioned between the digital signal board 20 and the power source board 30 to space apart the digital signal board 20 and the power source board 30. Specifically, each output interface 60 spaces apart the digital signal board 20 and the power source board 30, such that the gap between the digital signal board 20 and the power source board 30 is maximized in the limited interior space of the shell 10, and therefore heat generated by the digital signal board 20 and the power source board 30 during working dissipates in the most effective manner, further the influence on the connector converter by the high temperature is avoided, and stability and reliability of working of the connector converter are ensured.

In the present embodiment, as shown in FIGS. 2-4, the digital signal board 20 is electrically connected to the power source board 30 via at least one pin header set 70. Specifically, the pin header set 70 can on the one hand, electrically connect the digital signal board 20 with the power source board 30 and ensure normal working of the digital signal board 20 and the power source board 30, and on the other hand, support the digital signal board 20 and the power source board 30, that is, reinforce the stability of the digital signal board 20 and the power source board 30 being provided in the shell 10, and avoid falling off of the digital signal board 20 and the power source board 30 caused by action of the external force.

Further, one pin header set 70, two pin header sets 70 or three pin header sets 70 can be provided as needs actually.

More specifically, as shown in FIGS. 3 and 4, the arrangement position of each pin header set 70 can be the position on the other side corresponding to the output interface 60, in this way, interference between the pin head set 70 and the output interface 60 is avoided, it is ensured that the components are mounted in coordination with one another, do not affect working one another, and can achieve the normal function thereof respectively.

In the present embodiment, as shown in FIGS. 2 and 4, each of the pin header sets 70 comprises a plurality of connecting pin headers 71 which are provided side by side, and each of the connecting pin headers 71 is vertically welded between the digital signal board 20 and the power source board 30. Specifically, preferably, each pin header set 70 is composed of a plurality of connecting pin headers 71, for example, the number of the connecting pin headers 71 in each pin header set 70 can be five. Two ends of each connecting pin header 71 can be respectively inserted on the digital signal board 20 and the power source board 30, and the inserting positions between the connecting pin header 71 and the digital signal board 20 and between the connecting pin header 71 and the power source board 30 are reinforced by soldering tin, in this way, the mechanical connection between the connecting pin header 71 and the digital signal board 20 and the power source board 30 is ensured to be achieved, and the electric connection between the connecting pin header 71 and the digital signal board 20 and the power source board 30 is ensured to be achieved, and practicability of the physical design is high.

In the present embodiment, the output interfaces 60 are any combination of a USB interface, an HDMI interface, a DVI interface, an RJ45 interface and a Lightning interface. Specifically, the USB interface, the HDMI interface, the DVI interface, the RJ45 interface, and the Lightning interface can be selected as needs actually to be mounted on the digital signal board 20, wherein, the number of each kind of the interfaces can be selected as more than one, for instance, three USB interfaces are selected. Certainly, the USB interface, the HDMI interface and the RJ45 interface can also be selected to form an interface group to be mounted on the digital signal board 20.

In the present embodiment, the input interface 50 is a Type-C interface or a Micro USB interface. Specifically, the input interface 50 can be provided as a Type-C interface or a Micro USB interface as needed.

In this way, the output interface 60 and the input interface 50 listed above are used, such that types of connector converter products diversify, and therefore, the needs of different groups of people are met, and the market adaptability is higher.

In the present embodiment, as shown in FIGS. 3 and 4, the digital signal board 20 and/or the power source board 30 are provided with a plurality of electronic devices 120. Specifically, arrangement of the electronic device 120 is used for assisting working of the digital signal board 20 and the power source board 30, ensuring that the function attached to the connector converter can be achieved.

In the present embodiment, as shown in FIG. 2, the shell 10 comprises an outer frame 11 and two plugs 12, the outer frame 11 being provided with a mounting cavity and the mounting cavity penetrating through two ends in a length direction of the outer frame, the two plugs 12 being plugged at two ends of the mounting cavity, and the outer pockets 111 being formed in the outer frame 11 and/or the plug 12. Specifically, the outer frame 11 is a main body of the whole connector converter, playing a role of mounting and fixing each component, and the mounting cavity formed on the outer frame 11 is used for mounting and fixing of the digital signal board 20, the power source board 30 and each output interface 60. The structure is two ends of the mounting cavity being penetrated through, in this way, when the digital signal board 20 and the power source board 30 are mounted, same can be plugged into two end openings of the mounting cavity, and the two plugs 12 seal at the two end openings of the mounting cavity to prevent the digital signal board 20 and the power source board 30 from falling out of the outer frame 11. The well mounted output interface 60 right corresponds to the outer pocket 111, further each output interface 60 is exposed out and use is convenient.

In the present embodiment, as shown in FIG. 2, the shell 10 further comprises a plastic member 13, the plastic member 13 being fixed in the mounting cavity (not shown), the plastic member 13 being provided with an inner pocket 131 positioned corresponding to the outer pocket 111 formed in the outer frame 11, and the end of the output interface 60 corresponding to the inner pocket 131 being fixed to the inner pocket 131. Specifically, the function of the plastic member 13 is to reinforce each output interface 60, the inner pocket 131 provided thereon can ensure cooperation with the outer pocket 111, such that each output interface 60 is exposed. When each output interface 60 is in use, the end thereof bears larger force, and therefore when each output interface 60 is fixed to the inner pocket 131, strength of each output interface 60 can be improved via the plastic member 13, the output interface is prevented from falling off and occurrence of other problems after bearing a force, and the practicability of physical design is high.

In the present embodiment, the outer frame 11 is an aluminum alloy frame with an oxide layer formed on the surface. Specifically, being an aluminium alloy frame, the outer frame 11 has higher structural strength, and is not prone to deformation even if it falls from a height or bears a large external force, thereby effectively protecting components provided in the outer frame 11. In addition, due to the oxide layer formed on the surface of the aluminum alloy frame, the aluminum alloy frame is further prevented from interfering with the operation of the digital signal board 20 and the power source board 30.

The above description is only preferred embodiments of the invention, not intended to limit the present invention. Any modifications, equivalent replacements, or improvements made within the spirit and principles of the present invention should be included within the scope of protection of the present invention.

The invention claimed is:

1. A connector converter comprising:
    a shell;
    a circuit board assembly, wherein the circuit board assembly comprises a digital signal board integrated with a digital circuit, the digital signal board being provided in the shell, and the digital signal board is provided with a plurality of output interfaces,
    wherein the shell is provided with one or more outer pockets positioned corresponding to a respective output interface of the plurality of output interfaces such that the respective output interface is exposed; and
    a connecting wire, wherein an inner end of the connecting wire is provided with a metal plate, the metal plate being embedded in the digital signal board and electrically connected to the digital signal board via a connecting terminal, and wherein an outer end of the connecting wire extends out to the outside of the shell and is provided with an input interface, wherein the metal plate comprises:
        a middle plate part, wherein the middle plate part being fixedly connected to the inner end of the connecting wire;
        a first lateral plate part; and
        a second lateral plate part,
        wherein the first lateral plate part and the second lateral plate part being respectively connected to two ends of a same side of the middle plate part, and wherein the first lateral plate part and the second lateral plate part being both electrically connected to the digital signal board via the connecting terminal;
        wherein a bottom end of the first lateral plate part being provided with a first embedding part and a bottom end of the second lateral plate part being provided with a second embedding part; and
        wherein the digital signal board being provided with a first embedding groove and a second embedding groove at a position close to an end thereof, and wherein the first embedding part and the second embedding part being respectively embedded in the first embedding groove and the second embedding groove such that the metal plate is fixedly connected to the digital signal board.

2. The connector converter according to claim 1, wherein a connecting position between the connecting terminal and the metal plate is provided with a UV adhesive fixedly sealing on the digital signal board.

3. The connector converter according to claim 1, wherein the digital signal board is provided with a mounting notch positioned below a position between the first lateral plate part and the second lateral plate part, and the middle plate part is clamped in the mounting notch.

4. The connector converter according to claim 1, wherein the inner end of the connecting wire is fixedly connected to the middle plate part via a wire clamping ring.

5. The connector converter according to claim 1, wherein the circuit board assembly further comprises a power source board integrated with a power source circuit, wherein the power source board is provided in the shell and electrically connected to the digital signal board, and the digital signal board and the power source board are provided side by side.

6. The connector converter according to claim 5, wherein the digital signal board and the power source board are provided side by side in a vertical direction.

7. The connector converter according to claim 5, wherein the digital signal board and the power source board are provided at a distance from each other.

8. The connector converter according to claim 5, wherein the plurality of output interfaces are positioned between the digital signal board and the power source board to space apart the digital signal board and the power source board.

9. The connector converter according to claim 5, wherein the digital signal board is electrically connected to the power source board via at least one pin header set.

10. The connector converter according to claim 9, wherein each of the pin header set comprises a plurality of connecting pin headers which are provided side by side, and each of the connecting pin header is vertically welded between the digital signal board and the power source board.

11. The connector converter according to claim 1, wherein the plurality of output interfaces are any combination of a USB interface, an HDMI interface, a DVI interface, an RJ45 interface and a Lightning interface.

12. The connector converter according to claim 1, wherein the input interface is a Type-C interface or a Micro USB interface.

13. The connector converter according to claim 1, wherein the digital signal board, the power source board, or a combination thereof is provided with a plurality of electronic devices.

14. The connector converter according to claim 1, wherein the shell comprises:
an outer frame, wherein the outer frame is provided with a mounting cavity and the mounting cavity penetrates through two ends in a length direction of the outer frame; and
two plugs, wherein the two plugs are plugged at two ends of the mounting cavity, and the one or more outer pockets are formed in the outer frame, at least one of the two plugs, or a combination thereof.

15. A connector converter comprising:
a shell comprising an outer frame, the outer frame provided with a mounting cavity and the mounting cavity penetrates through two ends in a length direction of the outer frame, wherein the shell is provided with one or more outer pockets positioned corresponding to a respective output interface of the plurality of output interfaces such that the respective output interface is exposed;
a circuit board assembly, wherein the circuit board assembly comprises a digital signal board integrated with a digital circuit, the digital signal board being provided in the shell, and the digital signal board is provided with a plurality of output interfaces; and
a connecting wire, wherein an inner end of the connecting wire is provided with a metal plate, the metal plate being embedded in the digital signal board and electrically connected to the digital signal board via a connecting terminal, and wherein an outer end of the connecting wire extends out to the outside of the shell and is provided with an input interface,
wherein the shell further comprises a plastic member, the plastic member being fixed in the mounting cavity and provided with an inner pocket positioned corresponding to an outer pocket formed in the outer frame, wherein an end of the output interface corresponding to the inner pocket is fixed to the inner pocket.

16. The connector converter according to claim 14, wherein the outer frame is an aluminum alloy frame with an oxide layer formed on the surface of the aluminum alloy frame.

17. The connector converter according to claim 15, wherein the shell further comprises:
two plugs, wherein the two plugs are plugged at two ends of the mounting cavity, and the one or more outer pockets are formed in the outer frame, at least one of the two plugs, or a combination thereof.

* * * * *